Nov. 29, 1960 R. L. BRIGHT 2,962,603

ELECTRONIC SWITCH DEVICE

Filed June 21, 1954

WITNESSES

Robert C. Baird

David M. Schiller

INVENTOR

Richard L. Bright.

BY C. L. Freedman

ATTORNEY

Patented Nov. 29, 1960

2,962,603

ELECTRONIC SWITCH DEVICE

Richard L. Bright, Adamsburg, Pa., assignor to Westinghouse Electric Corporation, East Pittsburgh, Pa., a corporation of Pennsylvania Filed June 21, 1954, Ser. No. 438,060

2 Claims. (Cl. 307—88.5)

This invention relates to electronic switch devices and has particular relation to electronic switch devices employing three-electrode semi-conductor devices commonly referred to as "transistors."

In accordance with the invention, a pair of three-electrode transistor devices are connected in cooperating relation with a separate electrode of each transistor defining a switch terminal to provide a two terminal switch device. The switch device includes control means for controlling the conducting conditions of each transistor to thereby control the operating conditions of the switch device.

In accordance with a specific embodiment of the invention a pair of transistor switch devices is associated with an electrical circuit which includes a suitable load device connected for energization from a source of alternating current through a pair of parallel paths. Each of the paths includes a separate one of the transistor switch devices.

Control voltage producing means are provided in accordance with the invention for rendering the switch devices alternately opened and closed in phase opposition relative to each other to cause current to flow through the load device having polarity and magnitude which are functions of the phase relationship between the control voltage and the energizing alternating current.

In this specific embodiment of the invention, the control voltage producing means is connected to apply an alternating voltage having a rectangular wave pattern between the base electrode and a single other electrode of each transistor of the switch devices. According to a further embodiment of the invention, each of the switch devices includes a single transistor with control voltage producing means for applying an alternating voltage between the base and a single other electrode of the transistor.

It is, therefore, an object of the invention to provide an improved electronic switch device.

It is a further object of the invention to provide an improved two terminal electronic switch device capable of passing electrical current in either of two directions when in a closed operating condition.

It is another object of the invention to provide a two terminal switch device including a pair of cooperating three electrode transistor devices.

It is still another object of the invention to provide an electrical circuit including a load device connected for energization from an alternating current source through a pair of parallel paths each including a separate transistor switch device with control means for periodically altering the operating conditions of the switch devices in phase opposition relative to each other.

It is a still further object of the invention to provide an electrical circuit including a load device connected for energization from a first source of alternating current under control of a plurality of transistor switch devices with a second source of alternating current for controlling the operating conditions of the switch devices.

It is still another object of the invention to provide an electrical circuit as described in the preceding paragraph wherein the transistor switch devices are arranged to apply current to the load device having polarity and magnitude which are functions of the phase relationship between the first and second sources of alternating current.

Other objects of the invention will be apparent from the following description taken in conjunction with the accompanying drawings, in which.

Figure 1:
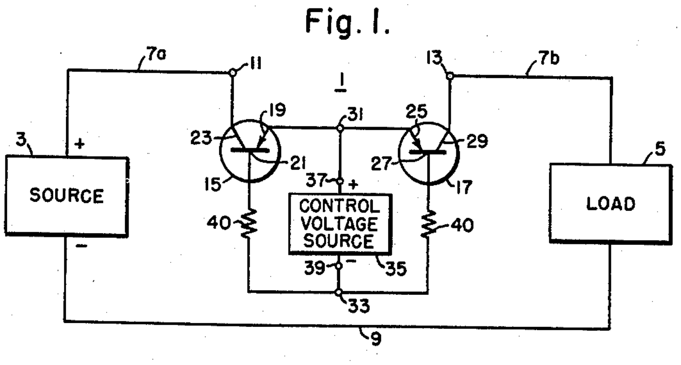
Figure 1 is a schematic representation of a transistor switch device embodying the teachings of the invention.

Referring to the drawings, there is illustrated in Figure 1 a schematic representation of an electronic switch device represented generally by the numeral 1 embodying the teachings of the invention.

For purposes of discussion, the device 1 is illustrated as being associated with an electrical circuit including a voltage source 3 connected to supply electrical energy to a suitable load device 5 through conductors *7a*, *7b* and 9. The source 3 may comprise any suitable source of electrical voltage such as a unidirectional voltage or an alternating voltage. For purposes of discussion, it will be assumed that the source 3 comprises a source of unidirectional voltage.

As shown in Fig. 1, the device 1 is connected in series relation with the conductors *7a* and *7b* for controlling the energization of the load device 5 from the source 3. The device 1 is provided with a pair of terminals 11 and 13 connected respectively to the conductors *7a* and *7b*. As will presently appear, the switch device 1 has two operating conditions, with one condition comprising an opened condition for preventing energization of the device 5 from the source 3 and with the other condition comprising a closed condition permitting energization of the device 5 from the source 3.

In accordance with the present invention, the switch device 1 includes a pair of three-electrode semi-conductor devices commonly referred to as "transistors." In accordance with a preferred embodiment of the invention, the transistors employed are of the junction type, although transistors of the point contact type may also be utilized. The junction transistors employed may be of any suitable type, such as the grown junction type, the fused junction type or the barrier layer type.

As is understood in the art, a junction type transistor includes a body of semi-conductor material, such as silicon or germanium, having prescribed impurities to provide at least three distinct regions with rectifying junctions between regions of opposite conductivity types. For purposes of the invention, it will be assumed in the following discussion that the transistors employed are of the p–n–p type. Suitable contacts are made at the terminal *p* regions to provide what are known as emitter and collector electrodes. A large area low resistance contact is made to the semi-conducting body to provide the base electrode. By applying suitable electrical potentials between the various electrodes, current conduction between the emitter and collector electrodes may be effectively controlled.

In application Serial No. 420,904, filed April 5, 1954, now Patent No. 2,885,570 dated May 5, 1959, by R. L. Bright and G. H. Royer, there is disclosed a method of biasing a junction type transistor wherein a biasing potential is applied between the base electrode and a single one of the emitter and collector electrodes. For example, in the case of a p-n-p transistor, a biasing potential may be applied between the base and the emitter electrodes. The magnitude of the biasing potential may be selected to provide various operating conditions of the transistor.

By proper selection of the magnitude and polarity of the biasing potential, the base electrode may be driven sufficiently negative relative to one of the emitter and collector electrodes to provide a "saturated" condition of the transistor. As herein employed, the term "saturation" means that a further increase in the magnitude of the forward current between the base and one of the emitter and collector electrodes has a negligible effect upon the magnitude of current flowing between the emitter and collector electrodes. For this condition, the resistance between the emitter and collector electrodes is of a relatively small value.

As a further example, the magnitude and polarity of the biasing potential may be selected to render the base electrode sufficiently positive relative to both the emitter and collector electrodes so as to provide a "cut-off" condition of the transistor. As herein employed, the term "cut-off" means that a further increase in the magnitude of the reverse voltage between the base and the emitter and collector electrodes is ineffective to further decrease current conduction between the emitter and collector electrodes. For this condition, the resistance between the emitter and collector electrodes is of a relatively large value. In the present invention, the above described method of biasing a junction transistor is employed.

As shown in Fig. 1, the switch device 1 includes a pair of transistors 15 and 17 with the transistor 15 having an emitter electrode 19, a base electrode 21 and a collector electrode 23, and with the transistor 17 having an emitter electrode 25, a base electrode 27 and a collector electrode 29. In accordance with the present invention, the emitters 19 and 25 are connected together as indicated by the connection 31 and the base electrodes 21 and 27 are connected together as indicated by the connection 33. The free ends of the collectors 23 and 29 define respectively the terminals 11 and 13 of the switch device 1.

In order to control the operation of the device 1, means are provided in accordance with the invention for controlling the conducting conditions of the transistors 15 and 17. To this end a biasing potential is applied between the emitter and base of each transistor to control the current flow between the emitter and collector of each transistor. The source of biasing potential is represented schematically in Fig. 1 by a block 35 and may comprise either a unidirectional biasing potential or an alternating biasing potential. For purposes of discussion, it will be assumed that the block 35 represents a source of alternating biasing potential having a rectangular wave pattern. The magnitude of the alternating biasing potential is selected to alternately drive the transistors 15 and 17 to saturated and cut-off current conducting conditions. The source 35 has a pair of terminals 37 and 39 connected respectively to the emitter electrodes 19 and 25 and to the base electrodes 21 and 27.

It has been observed that by connecting a separate impedance element 40 in each of the base circuits of the transistor devices 15 and 17 the waveform of the voltage produced by the source 35 may deviate to a certain extent from the desired rectangular configuration. For example, the waveform of the voltage generated by the source 35 may approach a sine wave configuration. The impedance elements 40 operate to "clip" the peaks of the sine wave to provide the desired rectangular waveform. The operation of the device 1 will now be explained according to the present understanding of the invention.

Let it be assumed initially that the source 35 has a polarity for a given half cycle such that the terminal 37 is positive relative to the terminal 39 as indicated in Fig. 1, and that the polarity of the source 3 is as shown in Fig. 1. Then the emitters 19 and 25 are at a positive potential relative to the base electrodes 21 and 27 of the transistors 15 and 17 with the result that both of the transistors 15 and 17 are in a saturated current conducting condition. It will be recalled that for this condition the electrical resistance between the emitter 19 and the collector 23 and between the emitter 25 and the collector 29 is of a relatively low value. Consequently, the electrical resistance between the terminals 11 and 13 of the device 1 is of a relatively low value and the device 1 is effectively in a closed operating condition to permit energization of the device 5 from the source 3.

For the succeeding half cycle of the alternating voltage of the source 35 the polarities of the terminals 37 and 39 are reversed from the polarities shown in Fig. 1 with the result that the emitter electrodes 19 and 25 are at a negative potential relative to the base electrodes 21 and 27. However, the source 3 is of such polarity as to render the collector 23 of transistor 15 positive relative to the base 21 thereof, and to render the collector 29 of transistor 17 negative relative to the base 27 thereof.

It will be recalled that in order to provide a cut-off condition of a p-n-p junction-type transistor, it is necessary that the base electrode be at a positive potential relative to both of the emitter and collector electrodes. Consequently, for the present condition, the transistor 17 is in a cut-off current conducting condition with the result that the switch device 1 is effectively in an opened operating condition to prevent energization of the load device 5 from the source 3. If it be assumed that the polarity of the source 3 is now reversed from the polarity shown in Fig. 1, then the collector 23 of transistor 15 is at a negative potential relative to the base 21 thereof with the same result that the device 1 is in an opened operating condition. From the preceding analysis, it is observed that the operation of the device 1 is independent of the polarities of the terminals 11 and 13 of the device 1, and that one of the transistors 15 and 17 will be in a cut-off current conducting condition to provide an opened operating condition of the device 1 for either polarity of the associated source 3.

By applying alternating control voltages to the transistors 15 and 17 having rectangular wave patterns, the operating conditions of the device 1 may be reversed almost instantaneously to provide an extremely quick switching action. Consequently, since the transistors 15 and 17 are continuously operated in either a saturated or cut-off current conducting condition, the power loss of the transistors is quite small. By means of the device 1, it is possible to control relatively large amounts of power by the application of a control voltage of relatively small power. As previously described the operation of the device 1 is independent of the polarities of the terminals 11 and 13 by reason of the symmetrical construction of the device 1. The device 1 is capable of controlling voltages produced by the source 3 of relatively small magnitudes with a high degree of efficiency. Furthermore, the switch device 1 possesses the desirable feature of being capable of passing electrical currents in either of two directions when the switch is in a closed operating condition. This feature permits the employment of the switch device 1 in electrical circuits where the use of conventional vacuum tube switches would not be feasible.

Figure 2:
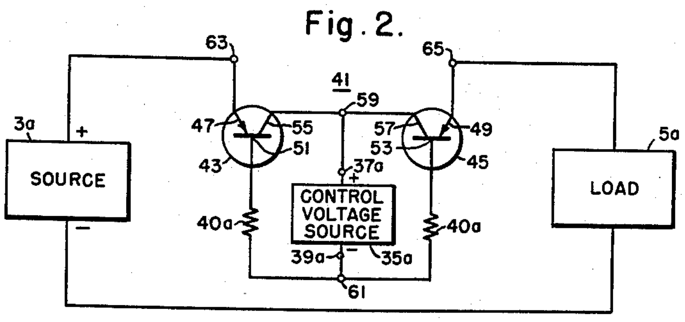
Fig. 2 is a schematic representation of a transistor switch device illustrating a different embodiment of the invention.

As shown in Fig. 2, there is provided in accordance with the invention a switch device represented generally by the numeral 41 of different construction than the device 1. For purposes of discussion the device 41 is illustrated as being associated with an electrical circuit similar to the circuit of Fig. 1 including a source of voltage 3*a* connected to energize a load device 5*a*.

The device 41 includes a pair of transistors 43 and 45 which are assumed to be of the p-n-p junction type. The transistors 43 and 45 have, respectively, emitter electrodes 47 and 49, base electrodes 51 and 53 and collector electrodes 55 and 57. As shown in Fig. 2, the collectors 55 and 57 are connected together as indicated by the connection 59 and the base electrodes 51 and 53 are connected together as indicated by the connection 61. The free ends of the emitters 47 and 49 define, respectively, terminals 63 and 65 of the device 41. Impedance elements 40*a* are provided in the base circuits of the transistors 43 and 45.

In order to control the operation of the device 41, a suitable control voltage is applied between the collectors 55 and 57 and the base electrodes 51 and 53. To this end a source 35*a* of alternating voltage having a substantially rectangular wave pattern may be provided which is similar to the source 35 of Fig. 1. The source 35*a* is provided with terminals 37*a* and 39*a* with the terminal 37*a* being connected to the collectors 55 and 57 and with the terminal 39*a* being connected to the base electrodes 51 and 53.

Let it be assumed that the alternating voltage of the source 35*a* has a polarity for a given half cycle, as shown in Fig. 2, with the terminal 37*a* being positive relative to the terminal 39*a*. Let it be further assumed that the polarity of the source 3*a* is as indicated in Fig. 2. For such conditions the collectors 55 and 57 are at a positive potential relative to the base electrodes 51 and 53 with the result that each of the transistors 43 and 45 is in a saturated condition to effectively close the switch device 41. For the succeeding half cycle the polarities of the terminals 37*a* and 39*a* will be reversed from the polarities shown in Fig. 2 with the result that the transistor 45 will be in a cut-off current conducting condition to provide an opened condition of the switch device 41. It may be shown that the operation of the switch device 41 is independent of the polarities of the terminals 63 and 65 as was explained in connection with the switch device 1.

It has been observed that in addition to possessing the advantages exhibited by the switch device 1, the switch device 41 is capable of performance which is considerably improved over the performance of the device 1 for relatively low values of controlled voltage. According to the present understanding of the invention, such improved performance is dependent to a large extent upon the reversal of the connections to the emitter and collector electrodes, as shown in Fig. 2, from the normal connections illustrated in Fig. 1. In presently available transistor devices, the collector junction is intentionally made larger than the emitter junction to provide a higher forward current gain than is possible with a symmetrical construction. It is assumed that such non-symmetrical construction is employed in the transistors 15 and 17 of Fig. 1. In the embodiment of Fig. 2 the functions of the emitter and collector electrodes have been reversed to provide the improved performance as explained previously.

Figure 3:
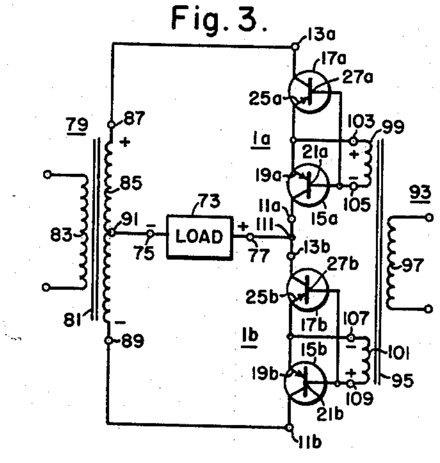
Fig. 3 is a schematic representation of an electrical circuit incorporating a plurality of switch devices of the type shown in Fig. 1; and, Fig. 4 is a schematic representation of an electrical circuit incorporating a plurality of switch devices constructed in accordance with a further embodiment of the invention.

Referring now to Fig. 3, there is illustrated a schematic representation of an electrical circuit embodying the teachings of the invention. As shown in Fig. 3, the circuit includes a load device 73 having a pair of terminals 75 and 77 connected for energization from a source of alternating voltage which, for purposes of discussion, is represented by an electromagnetic transformer 79. The transformer 79 is illustrated as including a magnetic core 81 with primary and secondary windings 83 and 85 linking the core 81. The secondary winding 85 has end terminals 87 and 89 and a center tap connection 91.

According to the present invention, a pair of identical transistor switch devices 1*a* and 1*b* are included in the circuit for controlling the energization of the device 73 from the transformer 79. The devices 1*a* and 1*b* are each illustrated as being identical to the device 1 of Fig. 1. However, if desired, the devices 1*a* and 1*b* each may be replaced by the device 41 of Fig. 2. Similar components of the devices 1*a* and 1*b* are represented by the same reference numerals as corresponding components of the device 1 but having, respectively, the suffixes *a* and *b*.

In order to control the operation of the devices 1*a* and 1*b*, a control voltage source is provided which is represented generally by the numeral 93. The source 93 may comprise any suitable voltage source capable of effecting the desired control of the devices 1*a* and 1*b*. In the specific embodiment of Fig. 3 the source 93 is represented by an electromagnetic transformer having a magnetic core 95 with a single primary winding 97 and a pair of secondary windings 99 and 101 linking the core 95. The winding 99 has a pair of terminals 103 and 105 and the winding 101 has a pair of terminals 107 and 109. Preferably an alternating voltage having a rectangular wave form is applied to the winding 97 to produce a separate alternating voltage of rectangular wave form across each of the windings 99 and 101. For purposes of discussion it will be assumed that the frequency of the alternating voltage applied to the winding 97 is identical to the frequency of the alternating voltage applied to the winding 83 of the transformer 79.

In accordance with the invention, the devices 1*a* and 1*b* are arranged to control the energization of the device 73 so that the current flowing through the device 73 has polarity and magnitude dependent upon the phase relationship between the voltages applied to the transformers 79 and 93. To this end the terminal 75 of the device 73 is connected to the tap 91 of the winding 85 and the terminal 77 of the device 73 is connected to a conductor 111 which connects the terminals 11*a* and 13*b* of the devices 1*a* and 1*b*, respectively. The terminal 13*a* of the device 1*a* is connected to the terminal 87 of the winding 85 and the terminal 11*b* of the device 1*b* is connected to the terminal 89 of the winding 85. With such arrangement, the device 73 is connected for energization from the transformer 79 through a pair of parallel paths each including a separate half of the winding 85 and a separate one of the switch devices 1*a* and 1*b*.

In order to provide the desired control of the operation of the devices 1*a* and 1*b*, the windings 99 and 101 are wound on the core 95 in opposing relation relative to each other. The terminal 103 of the winding 99 is connected to the emitters 25*a* and 19*a* of the transistors 17*a* and 15*a*. The terminal 105 is connected to the base electrodes 21*a* and 27*a* of the transistors 15*a* and 17*a*. In a similar manner the terminal 107 of the winding 101 is connected to the emitters 19*b* and 25*b* and the terminal 109 of the winding 101 is connected to the base electrodes 21*b* and 27*b* of the transistors 15*b* and 17*b*. The operation of the device of Fig. 3 will now be described.

Let it be assumed that the alternating voltage produced in the winding 85 of the transformer 79 is in phase with the alternating voltages induced in the windings 99 and 101 of the transformer 93, and that such voltages have polarities for a given half cycle as indicated by the various plus and minus signs associated with the windings. For such condition the emitter electrodes 19*a* and 25*a* are at a positive potential relative to the associated base electrodes 21*a* and 27*a* to produce a saturated condition of each of the transistors 15*a* and 17*a*. This saturated condition operates to effectively close the switch device 1*a*. Simultaneously, the emitter electrode 19*b* and the collector electrode 23*b* of the transistor 15*b* are at a negative potential relative to the associated base electrode 21*b* with the result that the switch device 1*b* is effectively in an opened condition. With this arrangement, the voltage appearing between the terminals 87 and 91 of the winding 85 is applied to the device 73 through the switch device 1*a* with the terminal 77 of the device 73 being at a positive potential relative to the terminal 75 thereof.

On the succeeding half cycle of the alternating voltages produced by the transformers 79 and 93 the polarities of such alternating voltages are reversed from the polarities initially assumed. For such condition, it may be shown that the operating conditions of the devices 1*a* and 1*b* are simultaneously reversed from the conditions existing during the preceding half cycle with the device 1*a* being in an opened condition and the device 1*b* being in a closed condition. Consequently, the voltage appearing between the terminals 89 and 91 of the winding 85 is applied to the device 73 through the switch device 1*b* with the terminal 77 thereof being at a positive potential relative to the terminal 75 thereof. It is observed that for each half cycle of the voltages produced by the transformers 79 and 93 that a unidirectional voltage is applied to the device 73 with polarity such that the terminal 77 thereof is at a positive potential relative to the terminal 75 thereof.

Let it now be assumed that the voltages produced by the transformers 79 and 93 are displaced in phase by 180° with the voltage across the winding 85 having the polarity as illustrated in Fig. 3, and with the voltages appearing across the windings 99 and 101 having polarities reversed from the polarities shown in Fig. 3 for a given half cycle. Then for such conditions it may be shown that the switch device 1*a* is in an opened operating condition and that the switch device 1*b* is in a closed operating condition with the result that the voltage appearing between the terminals 89 and 91 of the winding 85 is applied to the device 73 through the switch device 1*b* with polarity such that the terminal 77 is at a negative potential relative to the terminal 75.

For the succeeding half cycle it may be shown that the voltage appearing between the terminals 87 and 91 of the winding 85 is applied to the device 73 through the switch device 1*a* with the same polarity such that the terminal 77 is at a negative potential relative to the terminal 75. Consequently, it is observed that the polarity of the unidirectional voltage applied to the device 73 is dependent upon the phase relationship between the alternating voltages produced by the transformers 79 and 93, and that the polarity is reversed when such voltages are displaced in phase by 180° from the polarity when the voltages are in phase relationship.

In addition, it may be shown that the magnitude of current flowing through the load device 73 is a function of the phase relationship between the alternating voltages applied to the transformers 79 and 93. For example, when such voltages are in phase the current flowing through the device 73 is a maximum for one polarity, and zero for the opposite polarity. As the phase displacement between such voltages is progressively increased to 180°, the average magnitude of such current for the one polarity is progressively decreased to zero, whereas the average magnitude for the opposite polarity is progressively increased to a maximum. When the phase displacement between the two alternating voltages is increased from 180° to 360°, the average magnitude of such current for the one polarity is increased from zero to the original maximum value, and the average magnitude for the opposite polarity is decreased from the maximum value to zero.

In order to provide a device for producing a response which is a function of the phase relationship between the alternating voltages energizing the transformers 79 and 93, the load device 73 may comprise a suitably calibrated current responsive measuring instrument. For example, the device 73 may comprise a suitably calibrated permanent magnet instrument which is responsive to direct currents.

For certain purposes it may be desirable to replace the switch devices 1*a* and 1*b* with a pair of switch devices each including a single semi-conductor transistor device. With reference to the specific embodiment of Fig. 4, there is schematically shown an electrical circuit including certain components which are similar in operation and arrangement to certain components of the circuit of Fig. 3. Similar components of Figs. 3 and 4 are represented by the same reference numerals but with the components of Fig. 4 having the suffix "*a*" associated therewith.

Figure 4:
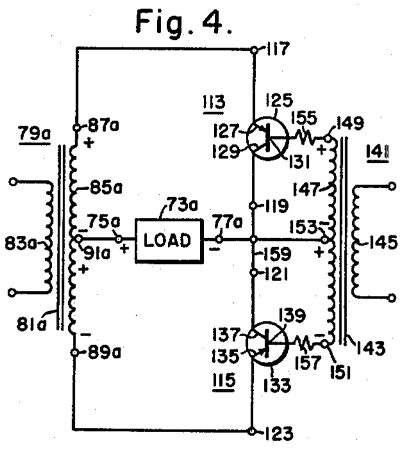

As shown in Fig. 4, a load device 73*a* is connected for energization from a transformer 79*a* under the control of a pair of switch devices 113 and 115. The device 113 has a pair of terminals 117 and 119 and the device 115 has a pair of terminals 121 and 123. As in the manner of the circuit of Fig. 3, the device 73*a* is connected for energization through a pair of parallel paths each including a separate half of the winding 85*a* of the transformer 79*a* and a separate one of the switch devices 113 and 115. As thus far described, the circuit of Fig. 4 is identical to the circuit of Fig. 3.

In accordance with the specific embodiment of Fig. 4, the device 113 includes a single transistor device 125 having an emitter electrode 127, a collector electrode 129 and a base electrode 131. The device 115 includes a single transistor device 133 having an emitter electrode 135, a collector electrode 137 and a base electrode 139. For purposes of discussion it will be assumed that each of the transistors 125 and 133 is of the p-n-p junction type.

In order to control the operation of the devices 113 and 115 a suitable control voltage source is provided. In a preferred embodiment of the invention the source is represented by a transformer 141 including a magnetic core 143 and primary and secondary windings 145 and 147 linking the core 143. The winding 147 has end terminals 149 and 151 and a center tap connection 153. As shown in Fig. 4, the terminal 149 is connected to the base electrode 131 of the transistor 125 through a resistor 155 and the terminal 151 is connected to the base electrode 139 of the transistor 133 through a resistor 157. The center tap 153 is connected to a conductor 159 which connects the collectors 129 and 137 of the transistors 125 and 133. In a preferred embodiment of the invention the winding 145 is energized by an alternating voltage having a substantially rectangular wave pattern to produce a separate alternating voltage having a rectangular wave pattern across each half of the winding 147.

It will be recalled that in order to provide a cut-off current conducting condition of a p-n-p junction type transistor, it is necessary that the base electrode be at a positive potential relative to both the emitter and collector electrodes. Consequently, in order to assure that each of the transistors 125 and 133 attains a cut-off condition for either polarity of the voltage across the winding 85*a*, the magnitudes of the voltages across each half of the winding 147 are selected to be slightly greater than the magnitude of the voltage appearing across the entire secondary winding 85*a*.

Let it be assumed that the voltages produced by the transformers 79*a* and 141 are in phase relative to each other and have identical frequencies of alternation. Let it further be assumed that the polarities of such voltages for a given half cycle are as indicated by the plus and minus signs associated with the windings. For this condition both the collector electrode 129 and the emitter electrode 127 of the transistor 125 are at negative potentials relative to the base electrode 131 thereof, and the collector electrode 137 of the transistor 133 is at a positive potential relative to the base electrode 139 thereof. The polarities are such as to cause the transistor 125 to be in a cut-off condition and to cause the transistor 133 to be in a saturated condition. Consequently, the device 113 is in an opened condition and the device 115 is in a closed condition with the result that the voltage appearing between the terminals 89*a* and 91*a* of the winding 85a is applied to the device 73a with the terminal 77a being at a negative potential relative to the terminal 75a.

For the succeeding half cycle the polarities of the voltages produced by the transformers 79a and 141 are reversed from the polarities shown in Fig. 4 with the result that the operating conditions of the devices 113 and 115 are reversed with the device 113 assuming a closed condition and with the device 115 assuming an open condition. Such reversal is effective to apply the voltage appearing between the terminals 87a and 91a of the winding 85a to the device 73a with polarity such that the terminal 77a is at a negative potential relative to the terminal 75a. Consequently, it is observed that for each half cycle of the voltages produced by the transformers 79a and 141 a unidirectional voltage is applied to the device 73a with polarity such that the terminal 77a is at a negative potential relative to the terminal 75a. By a similar analysis it may be shown that for a phase displacement between the voltages produced by the transformers 79a and 141 of 180° a unidirectional voltage is applied to the device 73a with the terminal 77a being at a positive potential relative to the terminal 75a.

As in the circuit of Fig. 3 the load device 73a of Fig. 4 may be adapted to produce a response which is a function of the phase relationship between the alternating voltages produced by the transformers 79a and 141. The resistance values of the resistors 155 and 157 are selected so that the current flowing between the collector electrodes 129 and 137 and the associated base electrodes 131 and 139 are sufficient to cause saturated conditions of the transistors 125 and 133.

Although the invention has been described with reference to certain specific embodiments thereof, numerous modifications falling within the spirit and scope of the invention are possible.

I claim as my invention:

1. An electrical switch, comprising a pair of nonsymmetrical semiconductor transistor devices each including a base electrode, an emitter electrode and a collector electrode, said collector electrode being larger than said emitter electrode, the collector electrodes of said transistor devices being connected together, the emitter electrodes of said transistor devices providing a pair of switch terminals, said switch having a closed operating condition between said terminals for a saturated current conducting condition of each transistor device, and having an opened operating condition for a cut-off current conducting condition of at least one of said transistor devices, and a pair of terminals adapted to be energized from a source of control voltage for controlling the operating conditions of said transistor devices, one of said last-named terminals being connected to the base electrodes and the other of said last-named terminals being connected to said collector electrodes of said transistor devices.

2. An electrical switch for controlling a low voltage circuit comprising a pair of asymmetric semiconductor transistor devies, said devices including regions of *p* and *n* types, each said device including a first and a second region of a material of a first of said types separated by a base region of a material of a second of said conductive types, means connecting one of said first and second regions of one of said devices to the corresponding said region of the other of said devices, a pair of switch terminals, the other of said first and second regions of said one device being connected to one of said switch terminals, the region of said other device corresponding to said other region of said first device being connected to the other of said switch terminals, and a control network for said devices, said network being connected between said base regions and said second regions of said devices, said regions being identifiable by the fact that when said first region is biased relative to said base region at a first polarity and said second region is biased relative to said base region in a polarity opposite to said first polarity and the magnitude of the bias between said first region and said base is varied the ratio of the magnitude of current change in said second region with respect to the magnitude of current change in said first region is greater than when both said polarities are reversed, said first polarity being that polarity which provides the larger current flow between said first and base regions when no bias is applied between said second and base regions.

References Cited in the file of this patent

UNITED STATES PATENTS

| | | |
|---|---|---|
| 2,281,395 | Travis | Apr. 28, 1942 |
| 2,597,886 | McCoy | May 27, 1952 |
| 2,655,609 | Shockley | Oct. 13, 1953 |
| 2,681,993 | Shockley | June 22, 1954 |
| 2,696,582 | Willard | Dec. 7, 1954 |
| 2,728,857 | Sziklai | Dec. 27, 1955 |
| 2,763,832 | Shockley | Sept. 18, 1956 |
| 2,783,384 | Bright et al. | Feb. 26, 1957 |
| 2,788,493 | Zawels | Apr. 9, 1957 |

FOREIGN PATENTS

| | | |
|---|---|---|
| 708,158 | Germany | July 14, 1941 |

OTHER REFERENCES

Electronics, March, 1953, pp. 112, 113.